(12) United States Patent
Kitabayashi et al.

(10) Patent No.: US 6,396,087 B1
(45) Date of Patent: May 28, 2002

(54) SEMICONDUCTOR INTEGRATED CIRCUIT

(75) Inventors: Shinji Kitabayashi, Yokohama; Tatsuya Higashi, Kawasaki; Ryoko Usuba, Yokosuka; Junya Shirakura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/714,516

(22) Filed: Nov. 17, 2000

(30) Foreign Application Priority Data

Nov. 18, 1999 (JP) .......................................... 11-328525

(51) Int. Cl.[7] .............................................. H01L 27/10
(52) U.S. Cl. ...................................... 257/207; 257/204
(58) Field of Search ................................ 257/207, 204, 257/208

(56) References Cited

U.S. PATENT DOCUMENTS

| | | | | |
|---|---|---|---|---|
| 5,216,632 A | * | 6/1993 | Wipfelder | 365/181 |
| 5,544,103 A | * | 8/1996 | Lambertson | 365/185.15 |
| 5,552,618 A | * | 9/1996 | Taniguchi et al. | 257/207 |
| 5,723,883 A | * | 3/1998 | Gheewalla | 257/204 |

FOREIGN PATENT DOCUMENTS

JP          9-148443          6/1997

* cited by examiner

*Primary Examiner*—David Nelms
*Assistant Examiner*—Thao P Le
(74) *Attorney, Agent, or Firm*—Finnegan, Henderson, Farabow, Garrett & Dunner, L.L.P.

(57) ABSTRACT

In a circuit in which logic cells are regularly arranged, to supply to a substrate substrate potentials different from a power supply voltage and ground voltage which are supplied to sources of transistors in the cell, substrate potential supplying cells are arranged in a region in which the logic cells are arranged. The substrate potential supplying cells are connected to the substrate potentials through an n-type substrate potential NSUB line and p-type substrate potential PSUB line. The substrate potentials are supplied to apply them to the substrate. If the substrate potential lines are arranged in the logic cell region, the element area is greatly reduced. However, using the substrate potential supplying cells VSC can improve area efficiency.

27 Claims, 14 Drawing Sheets

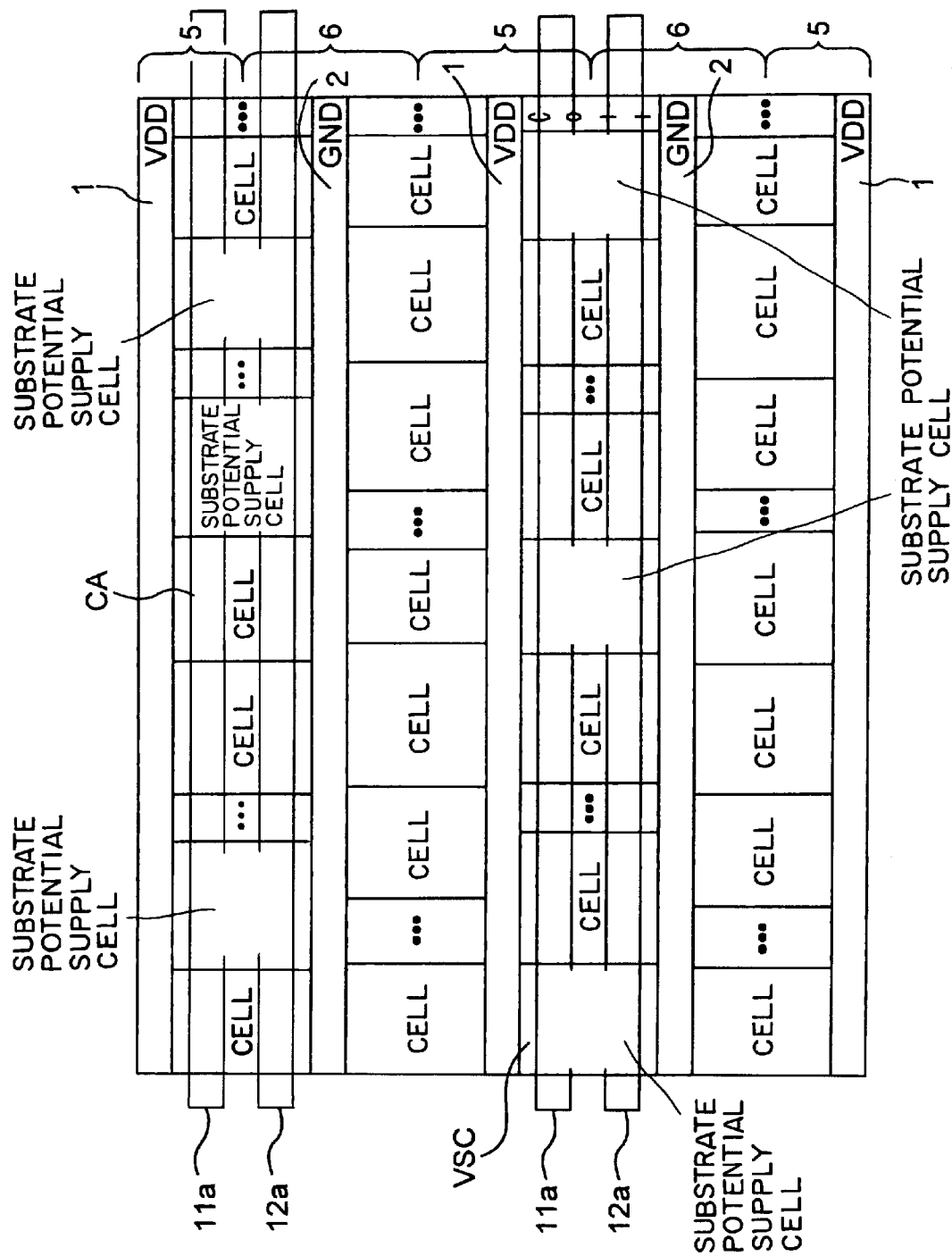
F I G. 11

SEMICONDUCTOR INTEGRATED CIRCUIT

CROSS REFERENCE TO RELATED APPLICATION

This application claims benefit of priority under 35USC §119 to Japanese Patent Application No. 1999-328525, filed on Nov. 18, 1999, the entire contents of which are incorporated by reference herein.

BACKGROUND OF THE INVENTION

The present invention relates to a semiconductor integrated circuit and, more particularly, to a circuit using different substrate potentials for power supply and ground voltages.

In some semiconductor integrated circuits, logic cells formed from transistors are regularly arranged, like standard cells or a gate array. FIG. 1 shows the arrangement of a conventional semiconductor integrated circuit.

Power supply voltage VDD lines 1 and ground voltage Vss lines 2 are alternately wired on a semiconductor substrate at a predetermined interval along the lateral direction in FIG. 1. Logic cells CA are arranged between the power supply voltage VDD lines 1 and the ground voltage Vss lines 2 along the lateral direction in FIG. 1. A vertical length Y of each logic cell CA in FIG. 1 is determined constant by the interval between the power supply voltage VDD line 1 and the ground voltage Vss line 2. A lateral length X in FIG. 1 can be freely set in accordance with the area of each logic cell CA.

Each logic cell CA has a cell formed from transistors. A region 5 including the power supply voltage VDD line 1 receives a power supply voltage VDD. P-channel MOS transistors (referred to as P-channel transistors, hereinafter) are formed in the region 5. A region 6 including the ground voltage Vss line 2 receives a ground voltage Vss. N-channel MOS transistors (referred to as N-channel transistors, hereinafter) are formed in the region 6.

FIG. 2 shows the layout of an inverter made up of P- and N-channel transistors respectively formed in the regions 5 and 6.

The region of each logic cell CA is present between the corresponding power supply voltage VDD and ground voltage Vss lines 1 and 2. The power supply voltage VDD line 1 formed on the substrate through an insulating film and an n-type diffusion layer 3 formed in the surface portion of the substrate are connected through a contact hole 10 formed in the insulating film. The power supply voltage VDD is supplied to this n-type diffusion layer 3.

The ground voltage Vss line 2 formed on the substrate via the insulating film, and the p-type diffusion layer 4 on the surface of the substrate are connected via the contact hole opened in the insulating film. The p-type diffusion layer is supplied with the ground voltage Vss.

The P-channel transistor 7 has a source region 25, drain region 26, and gate electrode 23. The source region 25 is connected to the power supply voltage VDD line 1 through a VDD line 21 formed through an insulating film. The VDD line 21 and the power supply voltage VDD line 1 are connected through a first interconnection layer (single layer). The VDD line 21 is connected to the source region 25 through a contact hole 29.

The N-channel transistor 8 has a source region 27, drain region 28, and gate electrode 24. The source region 27 is connected to the ground voltage Vss line 2 through a ground line 22 formed through an insulating film. The ground line 22 and the ground voltage Vss line 2 are connected through a first interconnection layer (single layer). The ground line 22 is connected to the source region 27 through a contact hole 30.

In the arrangement shown in FIGS. 1 and 2, the n-type substrate (n-type well) having the P-channel transistor 7 receives the same power supply voltage VDD as that supplied to the source of the transistor 7. The p-type substrate (p-type well) having the N-channel transistor 8 receives the ground voltage Vss having the same potential as that supplied to the source of the transistor 8. In recent years, however, a technique in which the source of the transistor and substrate potential are independently controlled to further improve the performance of the transistor layer has been used. FIG. 3 shows the arrangement of a conventional semiconductor integration circuit in this case.

An n-type substrate potential NSUB line 11a and p-type substrate potential PSUB line 12a are arranged at positions adjacent to the power supply voltage VDD line 1 and ground voltage Vss line 2, respectively, along the same direction. The n-type substrate potential NSUB line 11a supplies an n-type substrate potential NSUB to the n-type substrate having the P-channel transistor 7 through the contact hole 10. The p-type substrate potential PSUB line 12a supplies a p-type substrate potential PSUB to the p-type substrate having the N-channel transistor 8 through a contact hole 12.

The n-type substrate potential NSUB different from the power supply voltage VDD supplied to the source region 25 of the P-channel transistor 7 can be supplied to the n-type substrate. The p-type substrate potential PSUB different from the ground voltage Vss supplied to the source region 27 of the N-channel transistor 8 can be supplied to the p-type substrate.

Since, however, the n-type substrate potential NSUB line 11a and p-type substrate potential PSUB line 12a need be arranged at the positions adjacent to the power supply voltage VDD line 1 and ground voltage Vss line 2, respectively, and the substrate potential lines 11a and 12a occupy a large area, thereby deteriorating area efficiency.

SUMMARY OF THE INVENTION

The present invention has been made in consideration of the above situation, and has as its object to provide a semiconductor integrated circuit capable of supplying a potential different from that of the source of a transistor to a substrate and improving area efficiency.

According to the present invention, a semiconductor integrated circuit is provided, in which a plurality of cells are arranged in a cell region on a substrate and each of the cells has a first power supply line for supplying a first voltage (corresponding to either of the power supply voltage VDD and the ground voltage Vss in the embodiments) to the cell and a second power supply line for supplying a second voltage (corresponding to either of the power supply voltage VDD and the ground voltage Vss in the embodiments) to the cell, comprises:

a first substrate potential line having a first substrate potential;

a second substrate potential line having a second substrate potential; and a substrate potential supply cell arranged in the cell region and connected to the first and second substrate potential lines to supply the first and second substrate potentials to the substrate in accordance with a conductivity type of the substrate.

In this case, the substrate potential supply cell may be arranged at a position on the basis of a design standard about a distance between an element formed in the cell and a region for supplying the first and second substrate potentials to the substrate.

To supply the first and second substrate potentials different from the first and second voltages to the substrate, the semiconductor integrated circuit according to the present invention has the following arrangement. In place of wiring the first and second substrate potential lines in one direction in the logic cell region, the substrate potential supplying cell is arranged in the logic cell region, and the first and second substrate potentials are supplied to the substrate using this cell, thereby increasing the element area.

Also, according to the present invention, a semiconductor integrated circuit is provided, in which a plurality of cells are arranged in a cell region on a substrate and each of the cells has a first power supply line for supplying a first voltage to the cell and a second power supply line for supplying a second voltage to the cell, comprising:

a substrate potential line having a substrate potential; and a substrate potential supply cell arranged in the cell region and connected to the substrate potential line to supply the substrate potential to the substrate.

BRIEF DESCRIPTION OF THE DRAWINGS

FIG. 11 is a plan view showing the layout when the substrate potential supply lines are wired to be parallel to the power supply voltage lines and ground voltage lines, and the substrate potential supply cells are staggered or arranged at random in the semiconductor integrated circuit shown in FIG. 4;

DESCRIPTION OF THE PREFERRED EMBODIMENT

An embodiment of the present invention will be described below with reference to the accompanying drawings.

Figure 4:
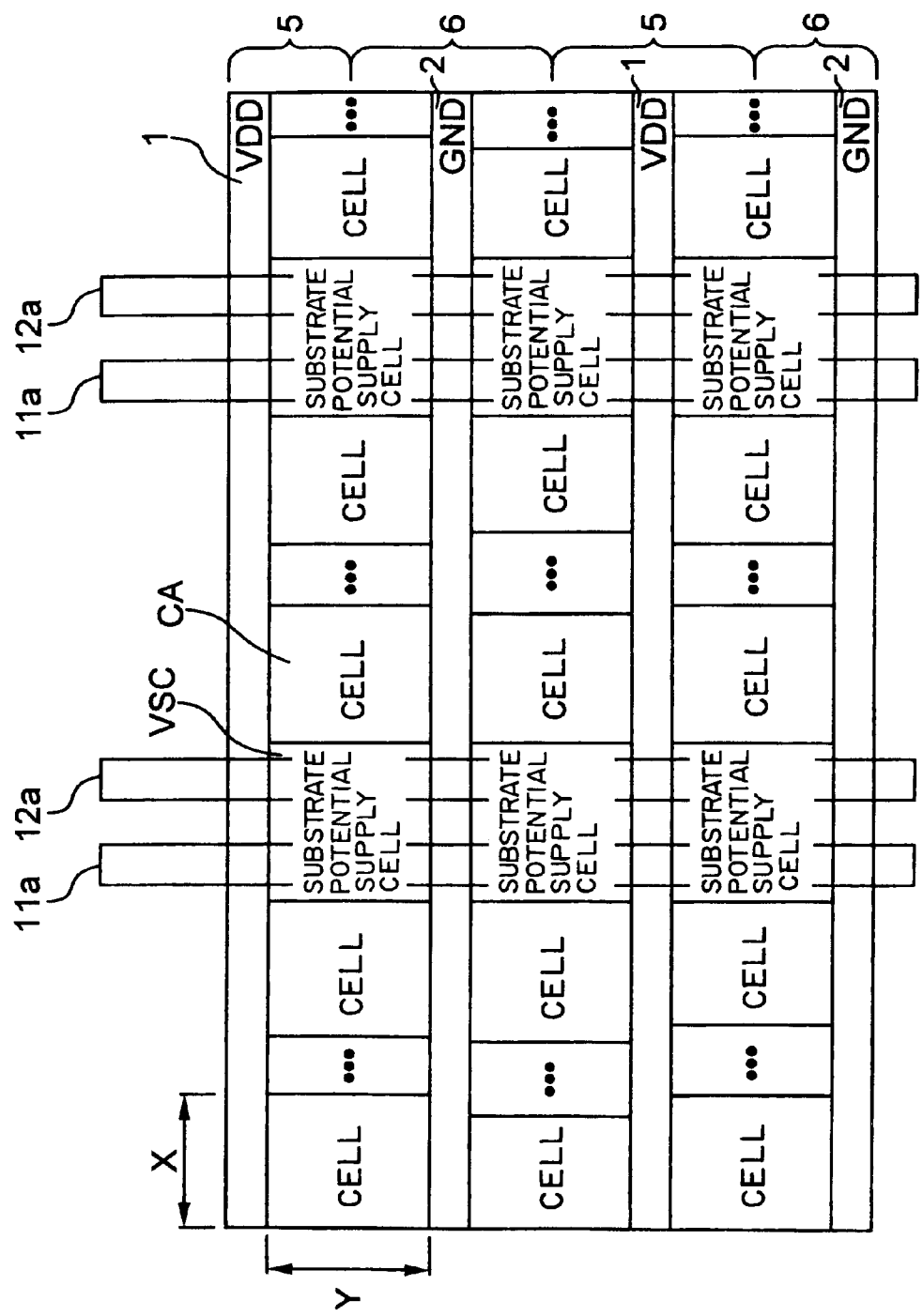
FIG. 4 is a plan view showing the arrangement of a semiconductor integrated circuit according to an embodiment of the present invention.

A semiconductor integrated circuit according to the embodiment of the present invention has the arrangement shown in FIG. 4. Power supply voltage VDD lines 1 and ground voltage Vss lines 2 are alternately wired, as a first interconnection layer, on a semiconductor substrate at a predetermined interval along the lateral direction in FIG. 4. Logic cells CA are arranged between the power supply voltage VDD lines 1 and the ground voltage Vss lines 2 along the lateral direction in FIG. 4. A vertical length Y of each logic cell CA in FIG. 4 is determined constant by the interval between the power supply voltage VDD line 1 and the ground voltage Vss line 2. A lateral length X in FIG. 4 is freely set in accordance with the area of each logic cell CA.

In each logic cell CA, a P-channel transistor operating upon receiving a power supply voltage VDD is formed in a region 5 including the power supply voltage VDD line 1. An N-channel transistor operating upon receiving a ground voltage Vss is formed in a region 6 including the ground voltage Vss line 2.

In this embodiment, an n-type substrate potential NSUB line 11a and p-type substrate potential PSUB line 12a are paired as a second interconnection layer in the vertical direction of the FIG. 4 perpendicular to the power supply voltage VDD lines 1 and ground voltage Vss lines 2. Substrate potential supplying cells VSC are further arranged in the cell arrangement region of the logic cells CA. The substrate potential supplying cells VSC are continuously arranged in the vertical direction along the n-type substrate potential NSUB line 11a and p-type substrate potential PSUB line 12a. The substrate potential supplying cells VSC receive an n-type substrate potential NSUB and p-type substrate potential PSUB from the substrate lines 11a and 12a and apply them to the n-type substrate (n-type well) and p-type substrate (p-type well), respectively.

Figure 5:
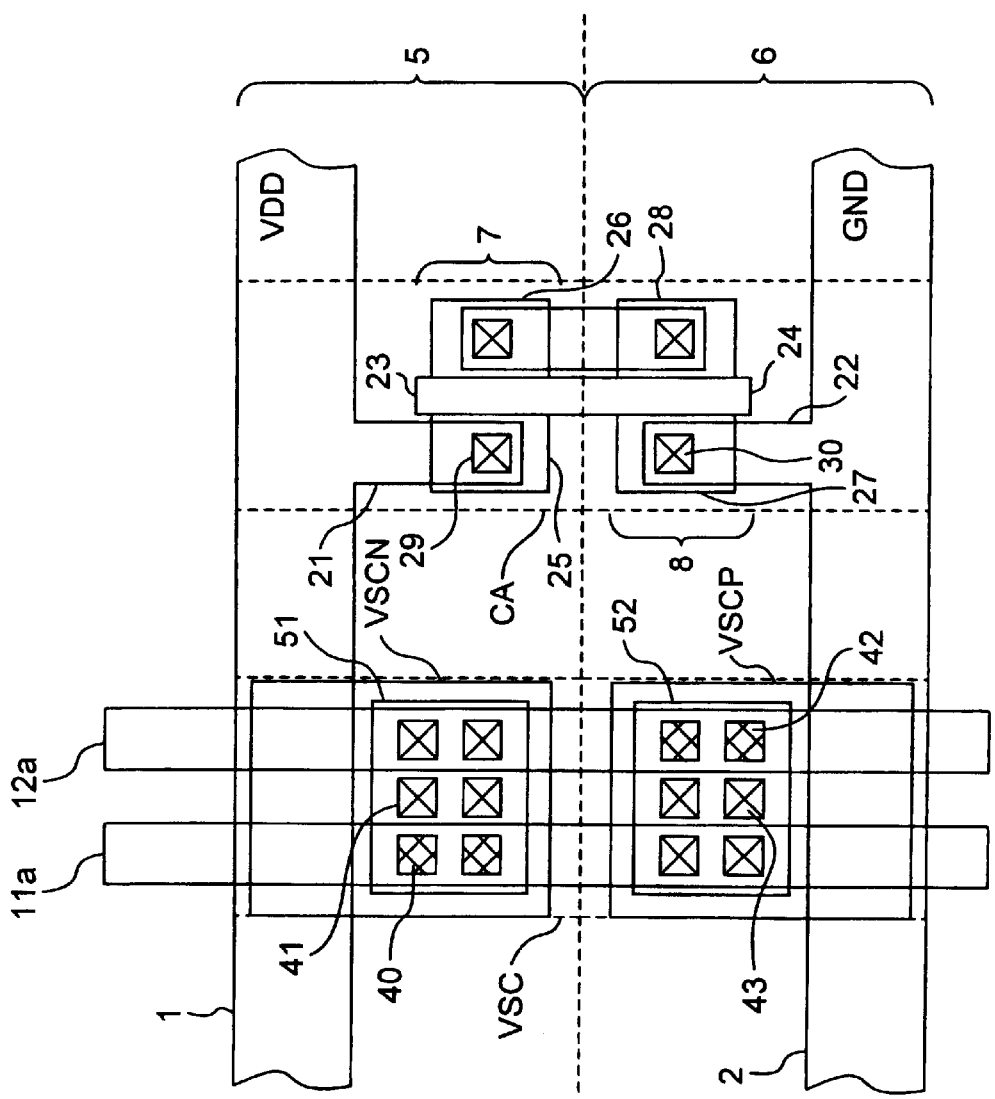
FIG. 5 is a plan view showing the layout of elements of the semiconductor integrated circuit shown in FIG. 4.

FIG. 5 shows the layout of an inverter made up of P- and N-channel transistors respectively formed in the regions 5 and 6 and the substrate potential supply cell VSC.

Figure 1:
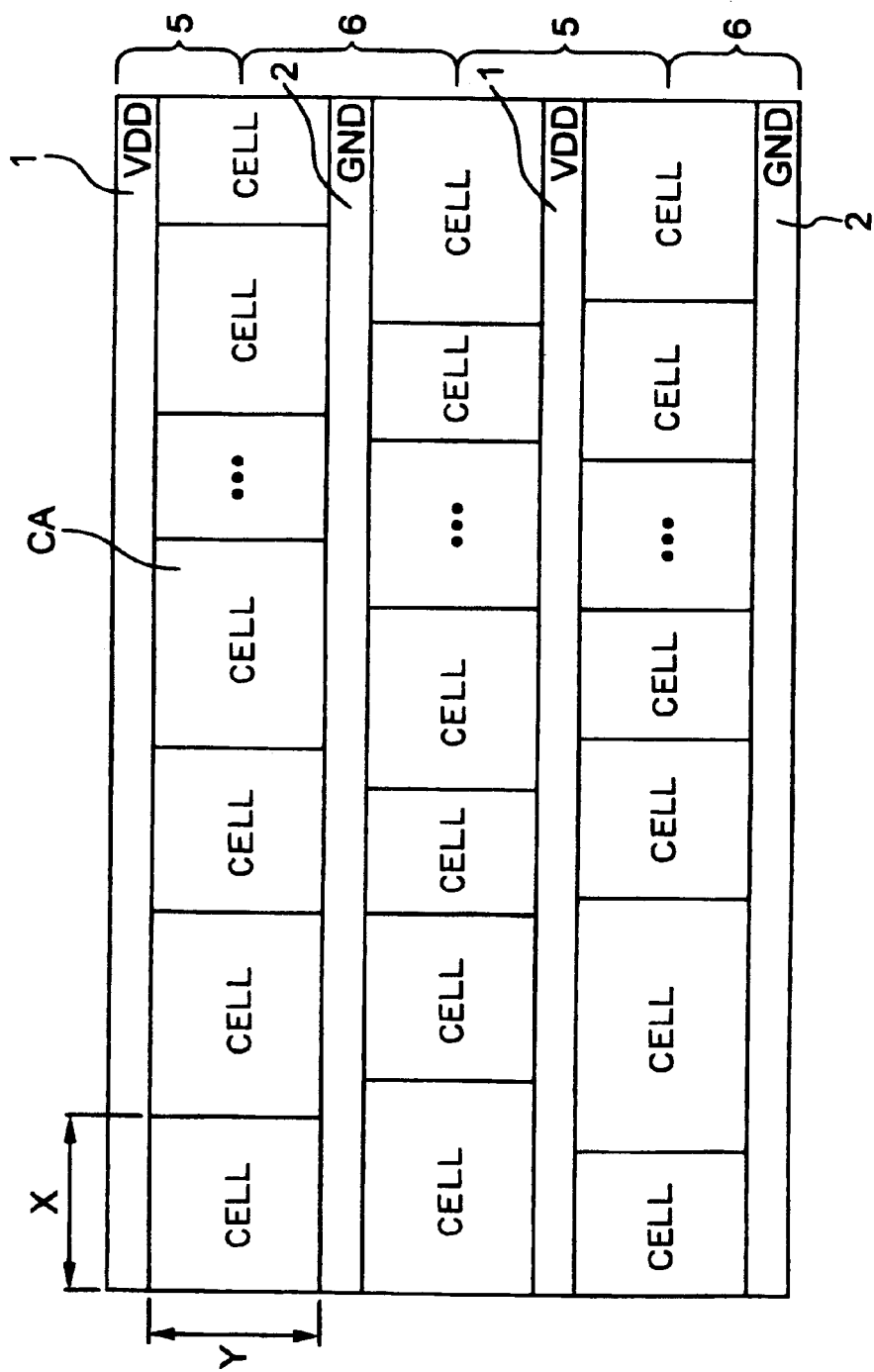
FIG. 1 is a plan view showing the arrangement of a conventional semiconductor integrated circuit.
Figure 2:
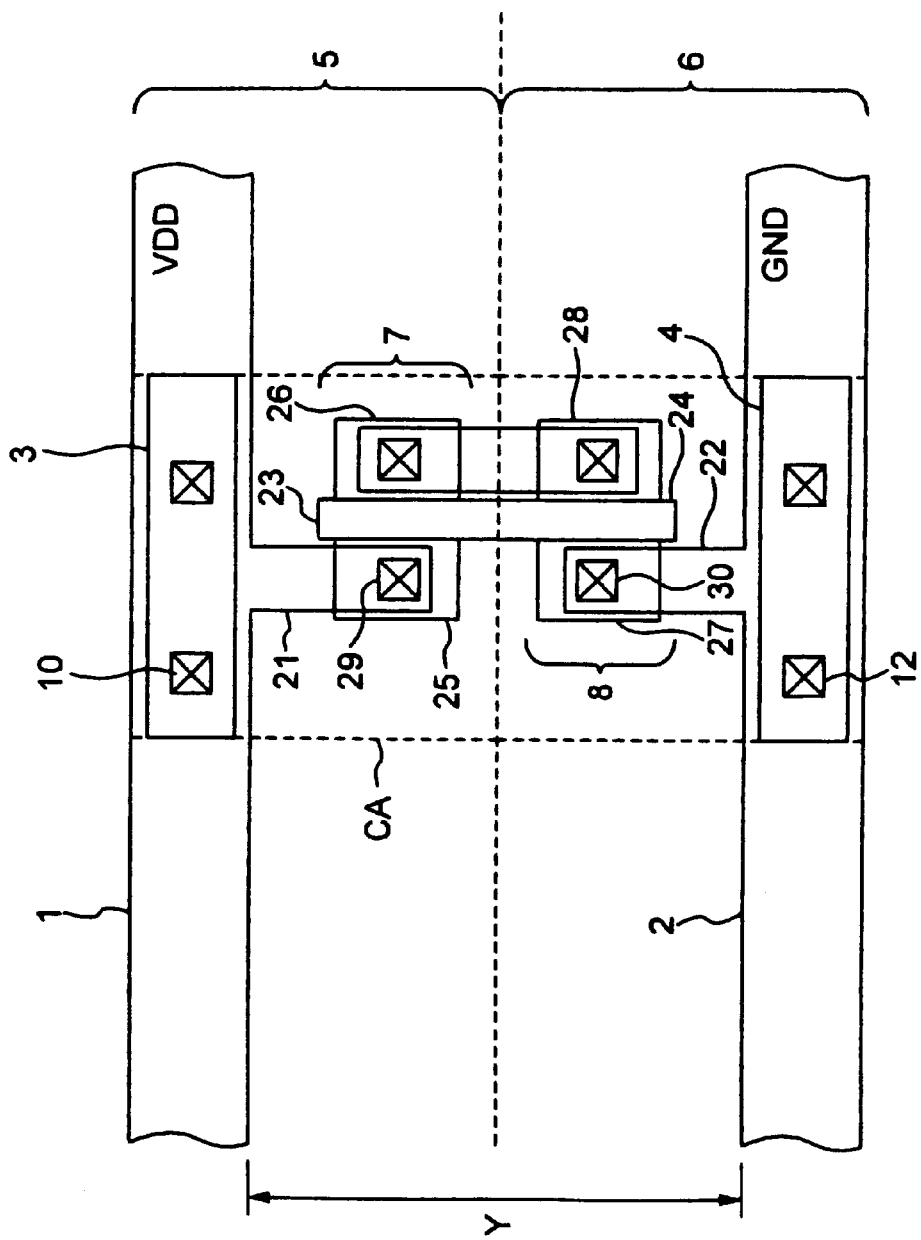
FIG. 2 is a plan view showing the layout of elements of the semiconductor integrated circuit shown in FIG. 1.

The layout of the inverter is the same as that of the conventional circuit shown in FIG. 1. More specifically, the region of each logic cell CA is present between the corresponding power supply voltage VDD and ground voltage Vss lines 1 and 2.

A P-channel transistor 7 has a source region 25, drain region 26, and gate electrode 23. A VDD line 21 serving as the first interconnection layer and connected to the power supply voltage VDD line 1 is connected to the source region 25 through a contact hole 29. The VDD line 21 supplies a power supply voltage VDD.

An N-channel transistor 8 has a source region 27, drain region 28, and gate electrode 24. A ground line 22 serving as the first interconnection layer and connected to the ground voltage Vss line 2 is connected to the source region 27 through a contact hole 30. The ground line 22 supplies a ground voltage Vss.

In the substrate potential supplying cell VSC, an n-type diffusion layer VSCN and a p-type diffusion layer VSCP are separately formed in the surface portion of the substrate. An n-type substrate potential interconnection 51 and p-type substrate potential interconnection 52 are respectively formed on the upper surfaces of the n- and p-type diffusion layers VSCN and VSCP as the first interconnection layer. The n-type substrate potential NSUB line 11a of the second layer is connected to the n-type substrate potential interconnection 51 through a via hole 40. The p-type substrate potential PSUB line 12a of the second layer is connected to the p-type substrate potential interconnection 52 through a via hole 42. The n-type substrate potential interconnection 51 is connected to the n-type diffusion layer VSCN through a contact hole 41 to supply the n-type substrate potential NSUB. The n-type substrate potential NSUB is, for example, equal to the power supply voltage VDD when the semiconductor integrated circuit is active, and higher than the power supply voltage VDD when it stands by. The p-type substrate potential interconnection 52 is connected to the p-type diffusion layer VSCP through a contact hole 43 to supply the p-type substrate potential PSUB. The p-type substrate potential PSUB is, for example, equal to the ground voltage Vss when the semiconductor integrated circuit is active, and lower than the ground voltage Vss when it stands by.

In the arrangement described above, by using layers overlying the first layer of the multilevel interconnection, the n-type substrate potential NSUB line 11a and p-type substrate potential PSUB line 12a can prevent interference between the intracell and intercell interconnections.

Figure 3:
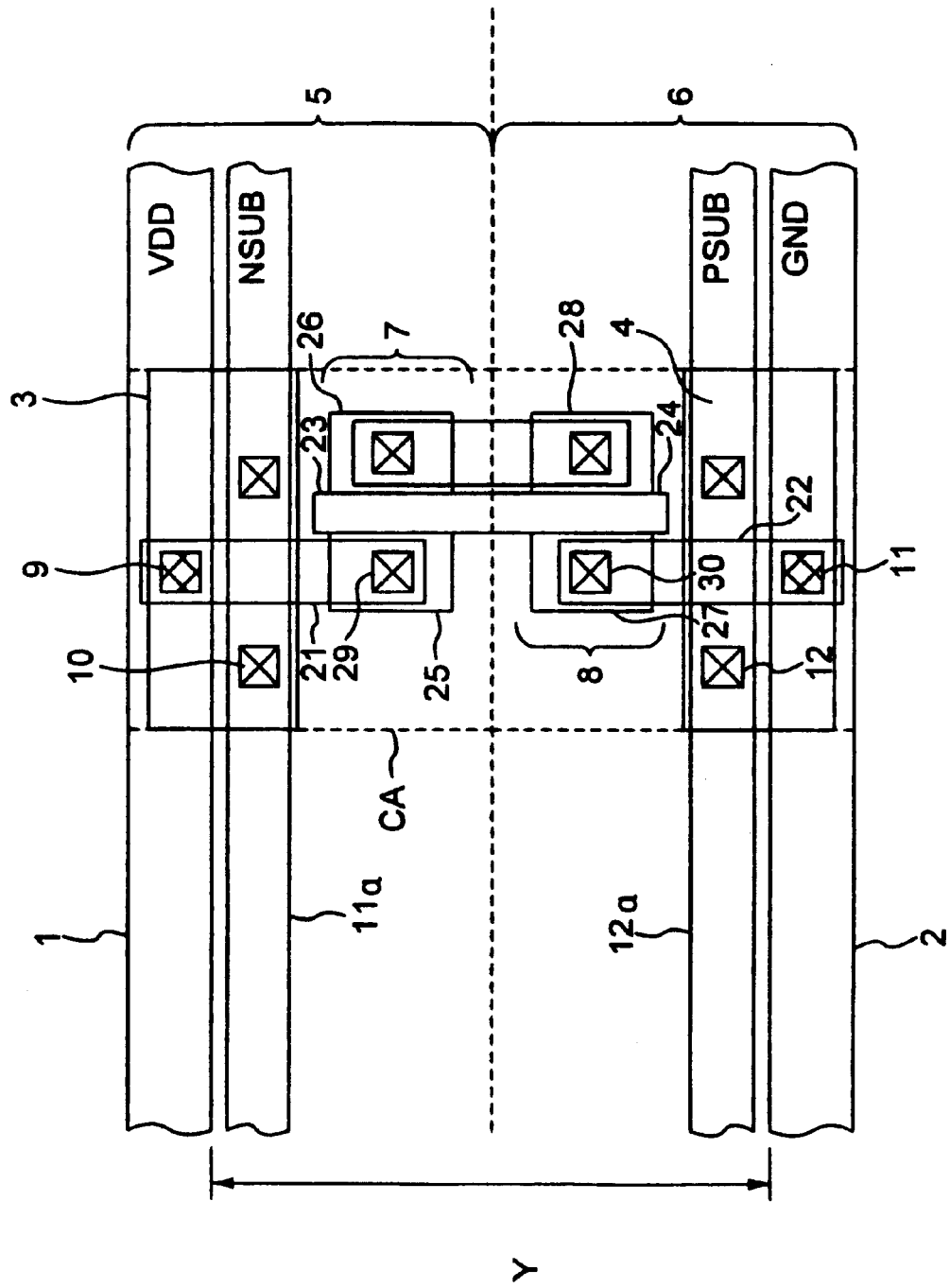
FIG. 3 is a plane view showing the layout when substrate potential supply lines are wired along a power supply voltage line and ground voltage line in the semiconductor integrated circuit shown in FIG. 1.

With this arrangement, by using the substrate potential supplying cells VSC formed in the region of the logic cells CA, the n-type substrate potential NSUB is supplied to the n-type substrate having the P-channel transistor 7, and the p-type substrate potential PSUB is supplied to the p-type substrate having the N-channel transistor 8. Unlike the conventional circuit shown in FIG. 3, this arrangement need not wire the n-type substrate potential NSUB line 11a and p-type substrate potential PSUB line 12a along the power supply voltage VDD line 1 and ground voltage Vss line 2 in the cell region. Thus, the area efficiency can be improved.

Many cell libraries stored as CAD data are so arranged as to apply the power supply voltage VDD and ground voltage Vss having the same potentials as the sources of the transistors to the n- and p-type substrates. When, however, the substrate potentials different from those of the sources of the transistors are to be applied to the p- and n-type substrates using the conventional technique shown in FIG. 3, the change in layout of each logic cell CA wastes time.

In contrast to this, according to this embodiment shown in FIG. 5, the substrate potential supplying cells VSC are only arranged between the logic cells CA, and their layout is not influenced. Accordingly, the existing design resources can be used with little change, thereby improving design efficiency.

Also, the substrate potential supplying cells VSC are preferably arranged complying with design standards. More specifically, the substrate potential supplying cells VSC are so arranged as to satisfy the standard about a distance between the n-type diffusion layer VSCN and the gate electrode 23 of the P-channel transistor 7, and the standard about a distance between the p-type diffusion layer VSCP and the gate electrode 24 of the N-channel transistor 8.

Note that, in a case wherein the cells are laid out using an existing cell library on the basis of this embodiment, the cell library contains data about the n- and p-type diffusion layers and contact holes that apply the power supply voltage VDD and ground voltage Vss to the substrates in the same manner as those of the sources of the transistors. These data must be deleted. More specifically, data about an n-type diffusion layer 3, a contact hole 10 connecting the n-type diffusion layer 3 and power supply voltage VDD line 1, a p-type diffusion layer 4, and a contact hole 12 connecting the p-type diffusion layer 4 and ground voltage Vss line 2 are deleted.

Figure 6:
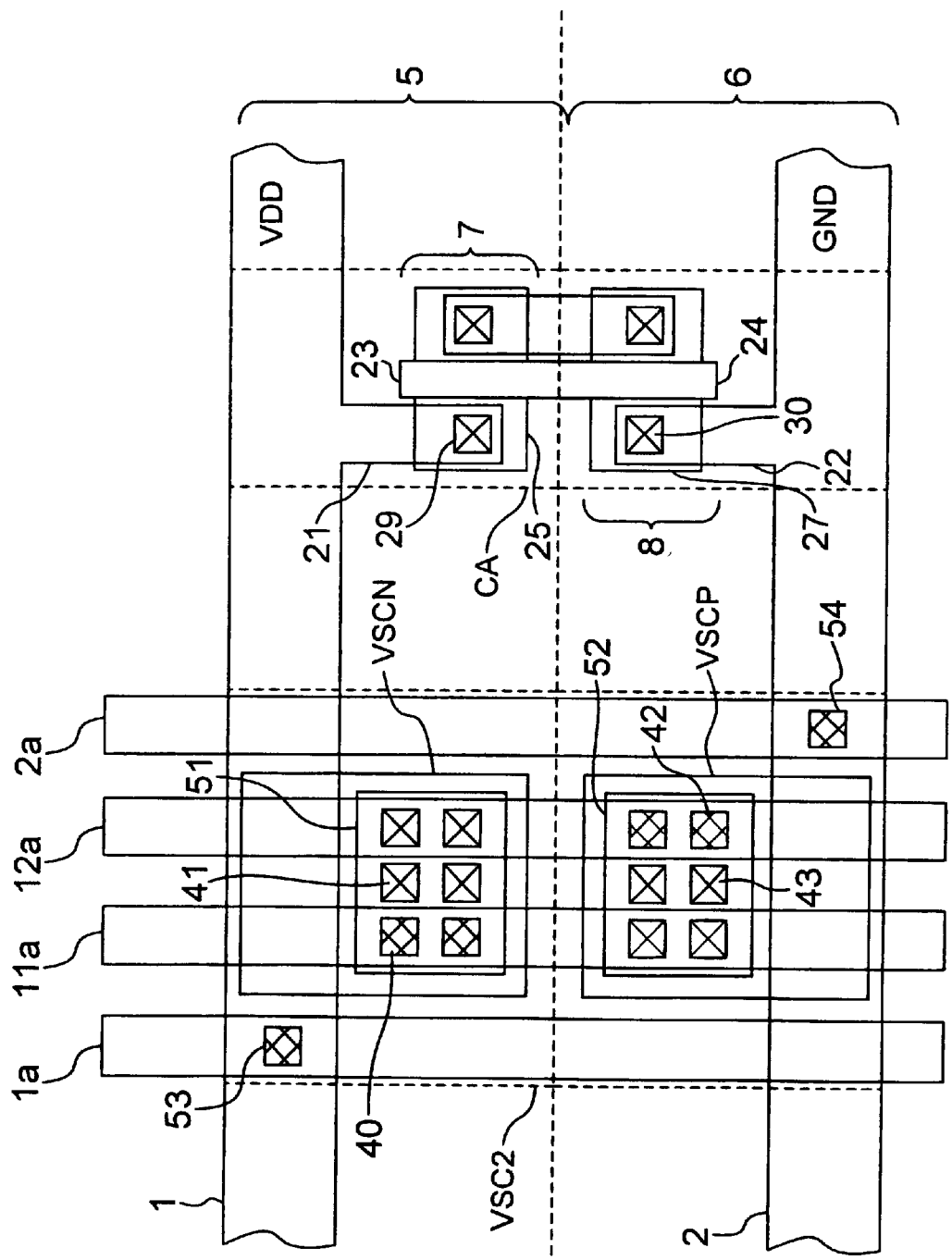
FIG. 6 is a plan view showing the layout when the semiconductor integrated circuit shown in FIG. 4 has power supply reinforcing lines.

Some logic cells CA have high power consumption. Such cells may cause variations in potentials of the power supply voltage VDD line 1 and ground voltage Vss line 2. In a substrate supply cell VSC2, as shown in FIG. 6, a power source voltage VDD reinforcement line 1a connected to the power source voltage VDD terminal (out of the cell region and not shown) and a ground voltage Vss reinforcement line 2a connected to the ground voltage Vss terminal (out of the cell region and not shown) may be arranged, as the second interconnection layer, to be adjacent to the n-type substrate potential NSUB line 11a and p-type substrate potential PSUB line 12a, respectively.

In this case, the power supply voltage VDD reinforcement line 1a is connected to the power supply voltage VDD line 1 through a via hole 53, and the ground voltage vss reinforcement line 2a is connected to the ground voltage Vss line 2 through a via hole 54.

Since such power supply voltage VDD reinforcement line 1a and ground voltage Vss reinforcement line 2a are arranged, potential variations in the power supply voltage VDD line 1 and ground voltage Vss line 2 can be prevented.

The embodiment described above is merely an example, and the present invention is not limited to this. In the above embodiment, for example, the n-type substrate potential NSUB line 11a and p-type substrate potential PSUB line 12a are arranged along the vertical direction in FIG. 4 different from that of the power supply voltage VDD line 1 and ground voltage Vss line 2, as shown in FIG. 4. The substrate potential supplying cells VSC are continuously arranged along the vertical direction in FIG. 4.

Figure 7:
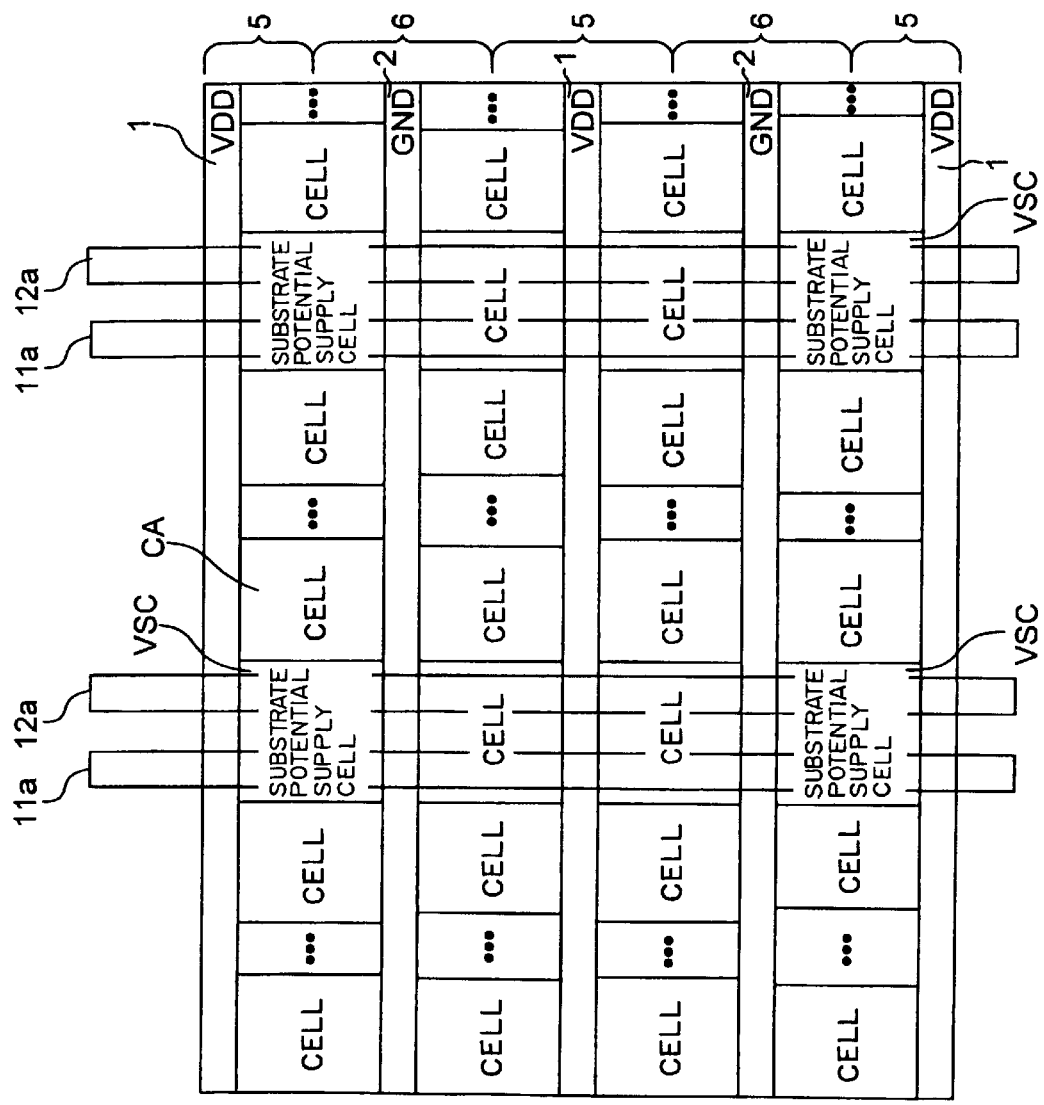
FIG. 7 is a plan view showing the layout when substrate potential supply cells are discontinuously arranged in the semiconductor integrated circuit shown in FIG. 4.

In contrast to this, in the layout shown in FIG. 7, the n-type substrate potential NSUB lines 11a and p-type substrate potential PSUB lines 12a are arranged along the vertical direction in FIG. 7. The substrate potential supplying cells VSC are discontinuously arranged along the vertical direction in FIG. 7. The substrate potential supplying cells VSC need not necessarily be continuously arranged along one direction. As described above, however, the substrate potential supplying cells VSC are preferably arranged to satisfy the design standards about the distance between the n-type diffusion layer and the gate electrode of the P-channel transistor and the distance between p-type diffusion layer and the gate electrode of the N-channel transistor.

Figure 8:
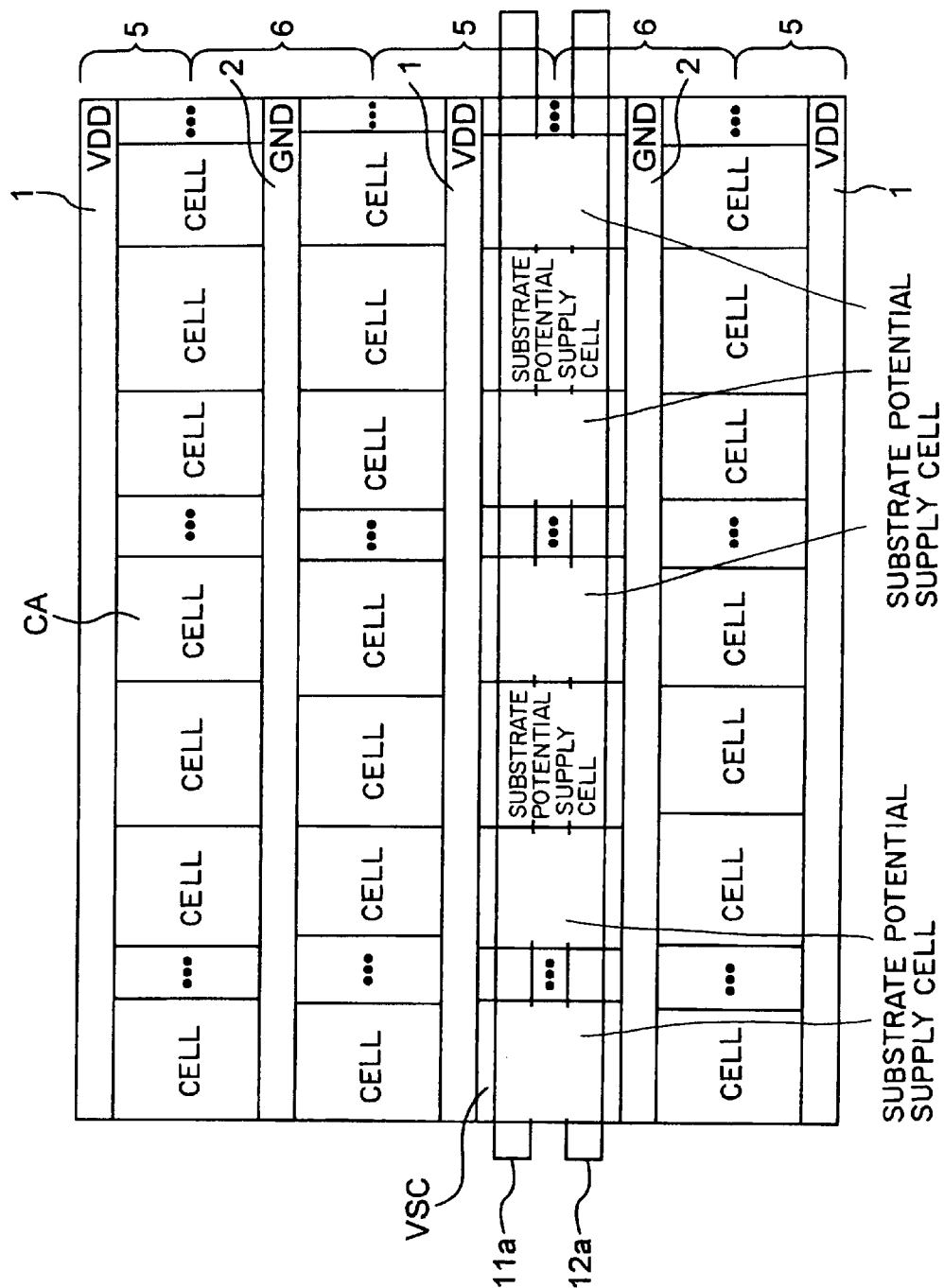
FIG. 8 is a plan view showing the layout when the substrate potential supply lines are wired to be parallel to the power supply voltage lines and ground voltage lines in the semiconductor integrated circuit shown in FIG. 4.

As shown in FIG. 8, the n-type substrate potential NSUB line 11a and p-type substrate potential PSUB line 12a may be arranged in the same lateral direction in FIG. 8 as that of the power supply voltage VDD lines 1 and ground voltage Vss lines 2. The substrate potential supplying cells VSC may be continuously arranged along the same lateral direction.

Figure 9:
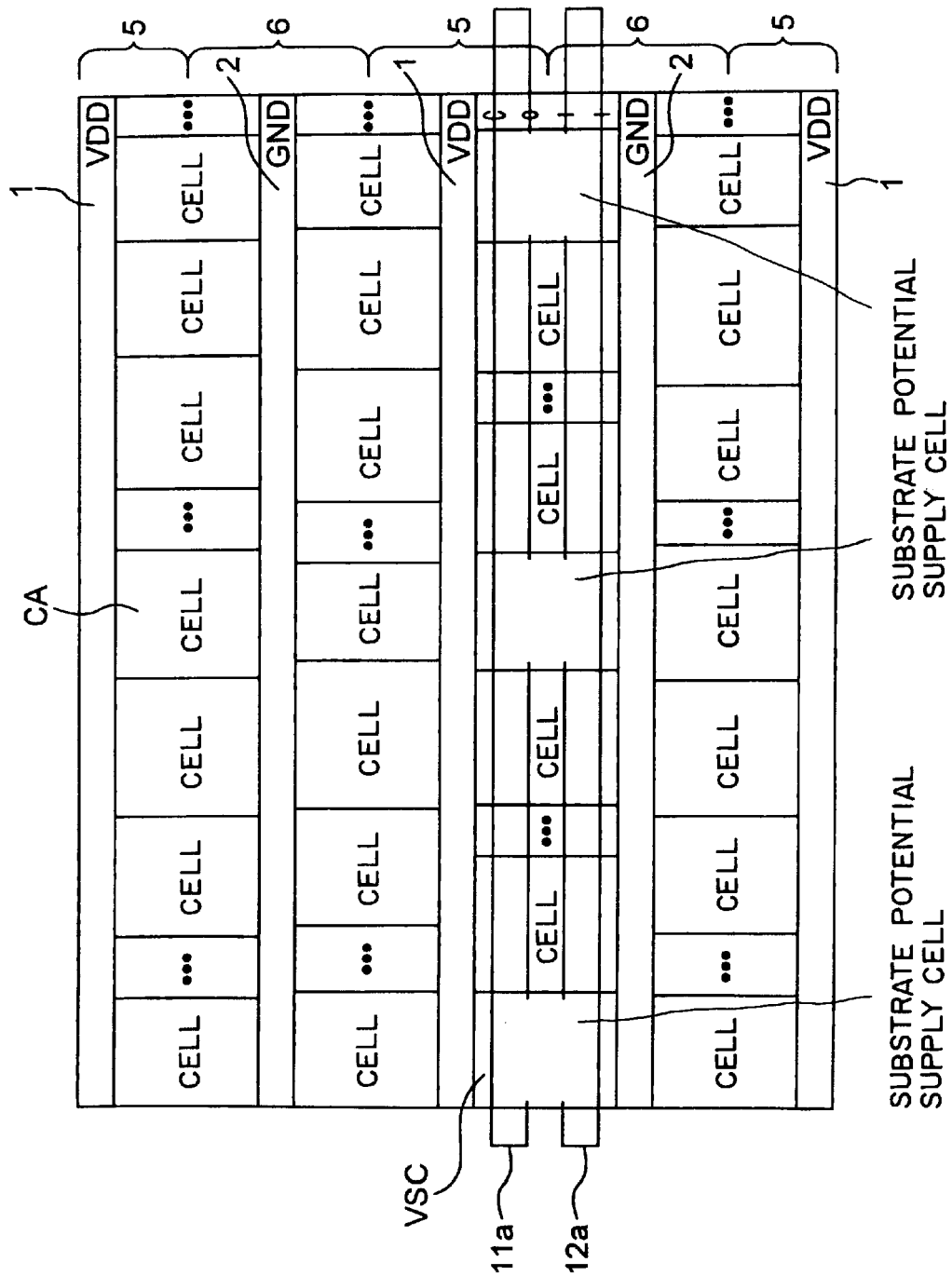
FIG. 9 is a plan view showing the layout when the substrate potential supply lines are wired to be parallel to the power supply voltages lines and ground voltage lines, and the substrate potential supply cells are discontinuously arranged in the semiconductor integrated circuit shown in FIG. 4.

The layout shown in FIG. 9 is common to that shown in FIG. 8 in that the n-type substrate potential NSUB line 11*a* and p-type substrate potential PSUB line 12*a* are arranged in the same lateral direction in FIG. 9 as that of the power Supply voltage VDD lines 1 and ground voltage vss lines 2, except that the substrate potential supplying cells VSC are discontinuously arranged along the same lateral direction.

Figure 10:
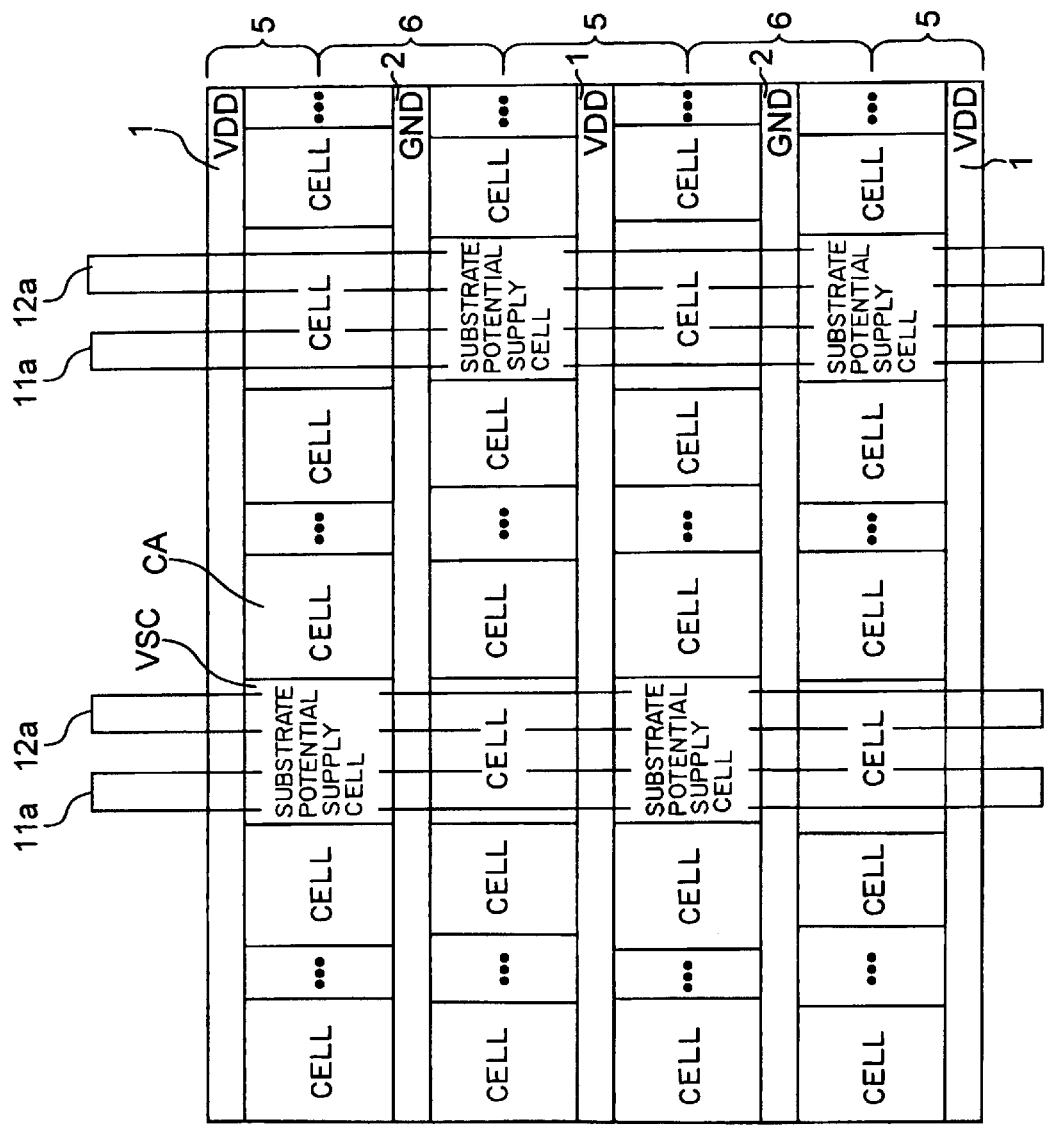
FIG. 10 is a plan view showing the layout when the substrate potential supply lines are wired in the direction perpendicular to the power supply voltage lines and ground voltage lines, and the substrate potential supply cells are staggered or arranged at random in the semiconductor integrated circuit shown in FIG. 4.

As shown in FIG. 10, the substrate potential supplying cells VSC may be staggered or arranged at random without regularity. Note that, in this example, the n-type substrate potential NSUB lines 11*a* and p-type substrate potential PSUB lines 12*a* are arranged along the direction perpendicular to the power supply voltage VDD lines 1 and ground voltage Vss lines 2.

As shown in FIG. 11, the n-type substrate potential NSUB lines 11*a* and p-type substrate potential PSUB lines 12*a* can be arranged along the same direction as that of the power supply voltage VDD lines 1 and ground voltage Vss lines 2, and the substrate potential supplying cells VSC can be staggered or arranged at random.

Figure 12:
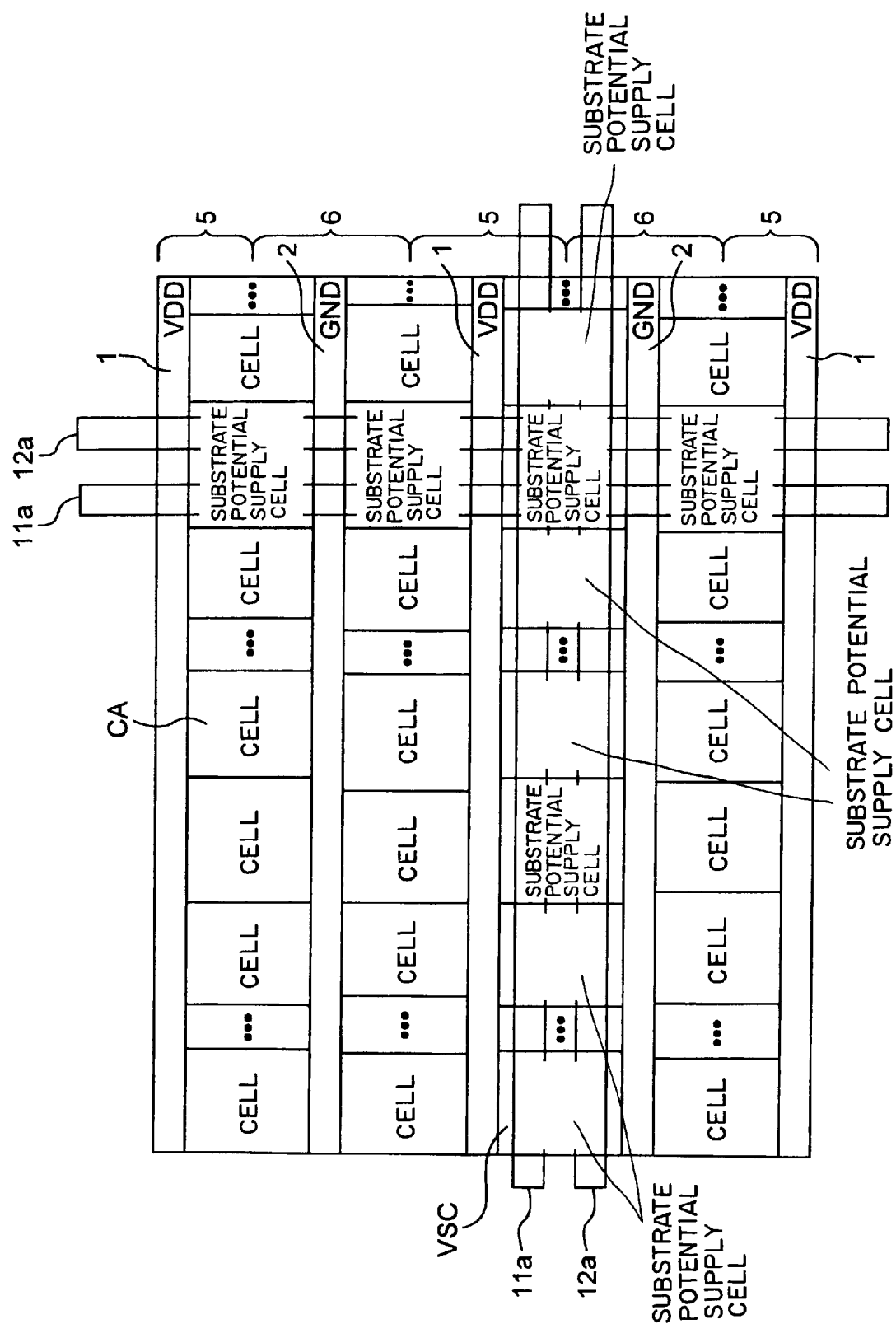
FIG. 12 is a plan view showing the layout when the substrate potential supply lines are wired in the directions parallel to and perpendicular to the power supply voltage lines and ground voltage lines, and the substrate potential supply cells are continuously arranged in the semiconductor integrated circuit shown in FIG. 4.

As shown in FIG. 12, the n-type substrate potential NSUB lines 11*a* and p-type substrate potential PSUB lines 12*a* may be arranged in the directions parallel to and perpendicular to the power supply voltage VDD lines 1 and ground voltage Vss lines 2. In this case, the substrate potential supplying cells VSC are continuously arranged.

Figure 13:
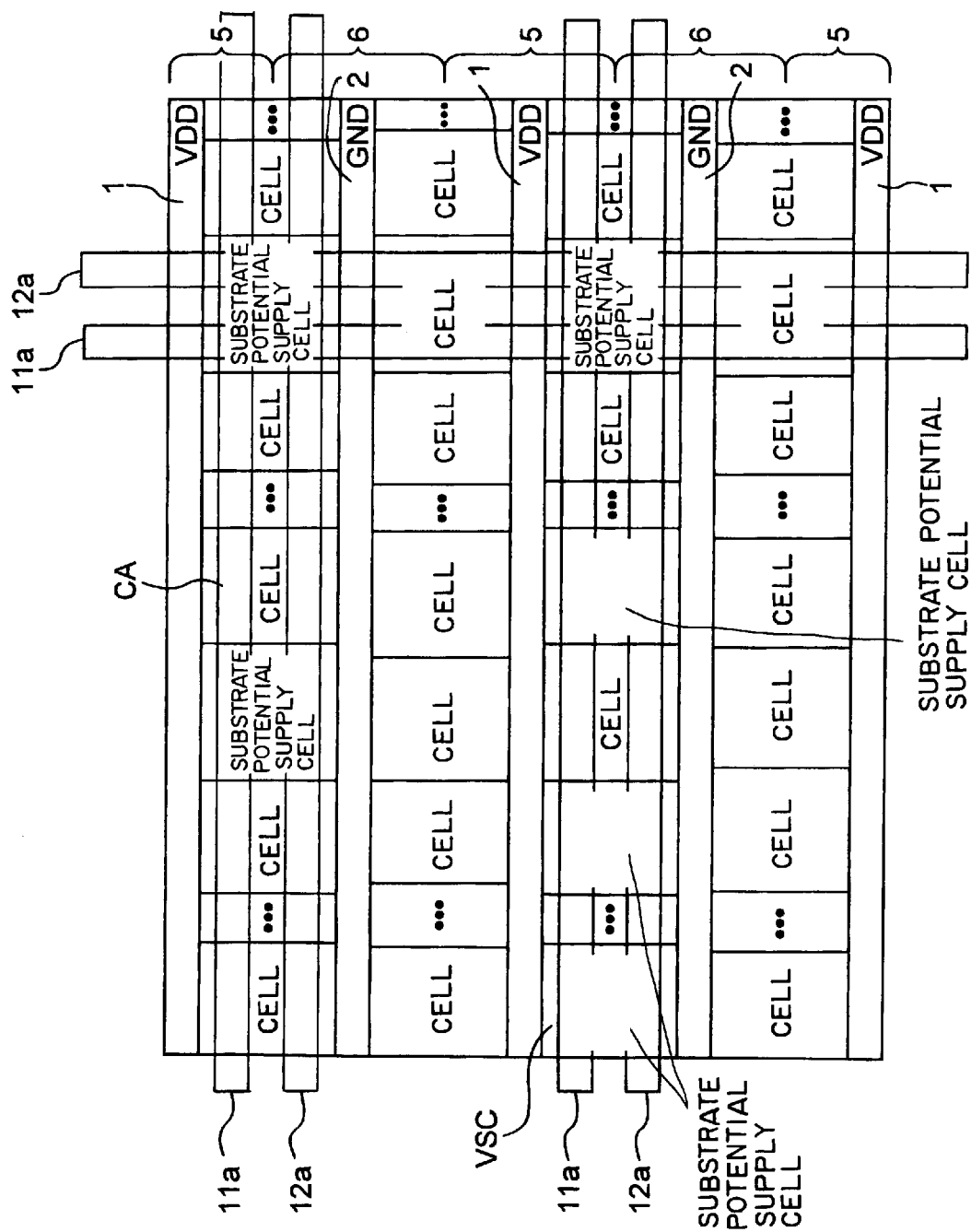
FIG. 13 is a plan view showing the layout when the substrate potential supply lines are wired in the directions parallel to and perpendicular to the power supply voltage lines and ground voltage lines, and the substrate potential supply cells are staggered or arranged at random in the semiconductor integrated circuit shown in FIG. 4.

As shown in FIG. 13, the substrate potential supplying cells VSC may be staggered or arranged or at random.

Figure 14:
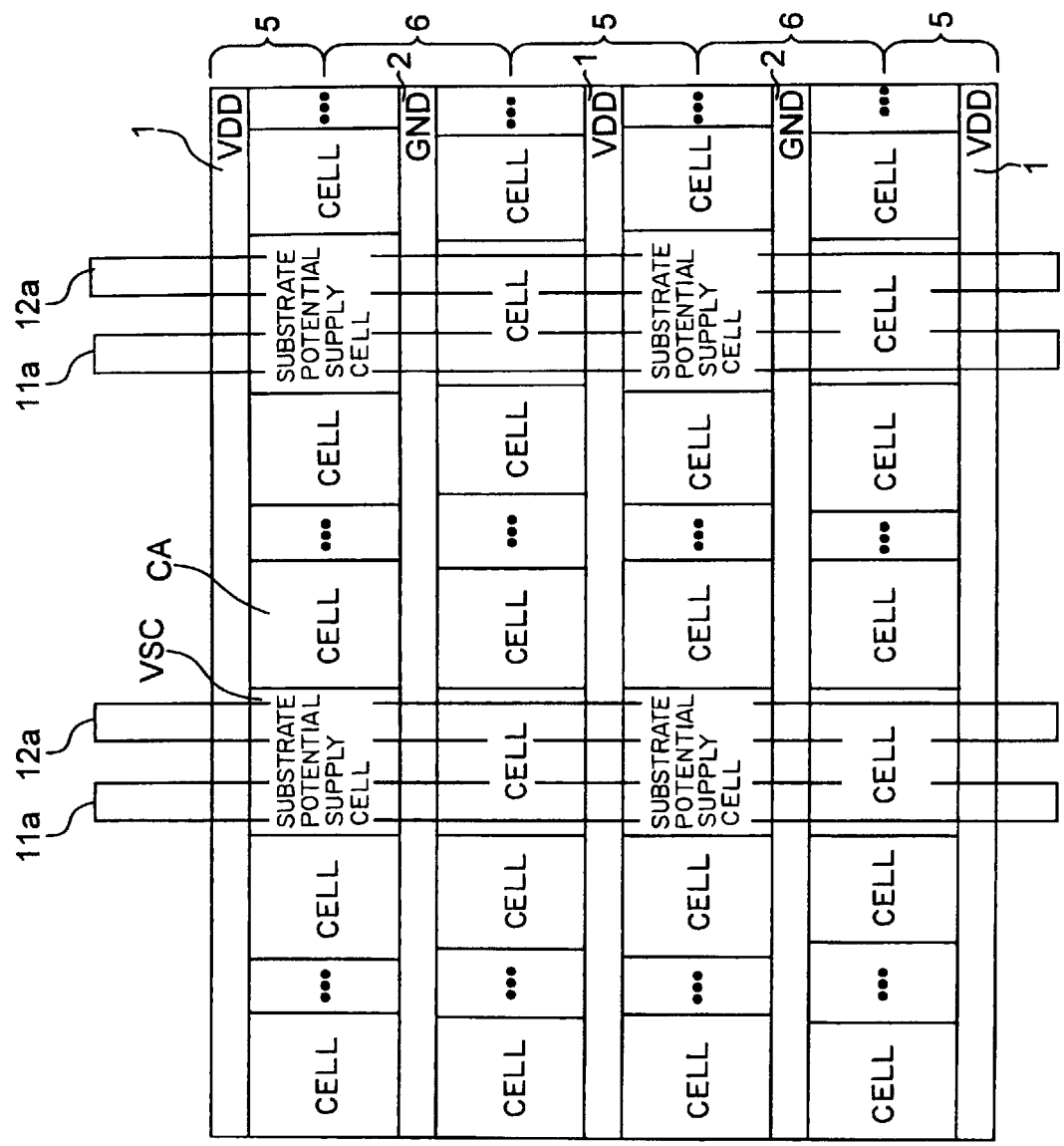
FIG. 14 is a plan view showing the layout when the substrate potential supply lines are wired in the direction perpendicular to the power supply voltage lines and ground voltage lines, and the substrate potential supply cells are alternately arranged in the semiconductor integrated circuit shown in FIG. 4.

Alternatively, the n-type substrate potential NSUB lines 11*a*, p-type substrate potential PSUB lines 12*a*, power supply voltage VDD lines 1, and ground voltage Vss lines 2 maybe arranged, as shown in FIG. 14.

In the layout shown in FIG. 14, similar to that shown in FIG. 4, the power supply voltage VDD lines 1 and ground voltage Vss lines 2 are alternately wired at a predetermined interval along the lateral direction in FIG. 14. The n-type substrate potential NSUB lines 11*a* and p-type substrate potential PSUB lines 12*a* are wired in the vertical direction in FIG. 14, as the second interconnection layer, so as to be perpendicular to the power supply voltage VDD lines 1 and ground voltage Vss lines 2.

In the layout shown in FIG. 4, however, the substrate potential supplying cells VSC are continuously arranged in the vertical direction along the n-type substrate potential NSUB lines 11*a* and p-type substrate potential PSUB lines 12*a*. In the contrast to this, in the layout shown in FIG. 14, the substrate potential supplying cells VSC are alternately arranged unlike that shown in FIG. 4. The logic cells CA are arranged in the region in which no substrate potential supplying cell VSC is formed.

The area of the necessary substrate potential supplying cells VSC is preferably minimized. This can increase the cell formable region of the logic cells CA. Assume, for example, that n-type wells are formed in a p-type substrate, a p-type substrate potential PSUB is supplied to the p-type substrate, and an n-type substrate potential NSUB is supplied to the n-type wells. In this case, since the whole p-type substrate is electrically connected, no problem arises even if cells supplying the p-type substrate potential PSUB are arranged apart. If the plurality of n-type wells are electrically connected to each other, a cell for supplying the n-type substrate potential NSUB is formed in one of the n-type wells, but need not be formed in units of n-type wells.

If, however, the plurality of n-type wells are independently arranged, the n-type substrate potential NSUB must be supplied in units of the n-type wells. In this case, as shown in FIG. 14, the substrate potential supplying cells VSC are alternately arranged so that the substrate voltage is supplied to all the n-type wells. In addition, the number of required substrate potential supplying cells VSC is minimized so that the maximum cell formable region of the logic cells CA can be assured.

Even in the layout shown in FIG. 14, the power source voltage VDD reinforcement line 1*a* and ground voltage Vss reinforcement line 2*a* shown in FIG. 6 may also be wired in the same direction as that of the n-type substrate potential NSUB lines 11*a* and p-type substrate potential PSUB lines 12*a*.

What is claimed is:

1. A semiconductor integrated circuit, comprising:
   a plurality of cells arranged in a cell region on a substrate and having at least one transistor;
   a first power supply line for supplying a first voltage to the cells;
   a second power supply line for supplying a second voltage to the cells;
   a first substrate potential line having a first substrate potential;
   a second substrate potential line having a second substrate potential; and
   a substrate potential supply cell arranged in the cell region, having no transistor, and connected to the first and second substrate potential lines to supply the first and second substrate potentials to the substrate in accordance with a conductivity type of the substrate.

2. The circuit according to claim 1, wherein said substrate potential supply cell is arranged at a position on the basis of a design standard about a distance between an element formed in the cell and a region for supplying the first and second substrate potentials to the substrate.

3. The circuit according to claim 1, wherein said first and second substrate potential lines are arranged in one direction different from that of the first and second power supply lines, and a plurality of substrate potential supply cells are continuously or discontinuously arranged along said one direction.

4. The circuit according to claim 3, wherein said first and second substrate potential lines comprise a wiring layer formed at a level upper to said first and second power supply lines.

5. The circuit according to claim 1, wherein said first and second substrate potential lines are arranged in one direction different from that of the first and second power supply lines, and a plurality of substrate potential supply cells are arranged every other cell region along said one direction.

6. The circuit according to claim 5, wherein said first and second substrate potential lines comprise a wiring layer formed at a level upper to said first and second power supply lines.

7. The circuit according to claim 3, which further comprises
   a third power supply line for supplying the first voltage to the cell via said first power supply line, and
   a fourth power supply line for supplying the second voltage to the cell via said second power supply line,
   said third and fourth power supply lines being arranged to be substantially parallel to said first and second substrate potential lines.

8. The circuit according to claim 7, wherein said third power supply line is connected to a terminal supplied with the first voltage out of the cell region, and said fourth power supply line is connected to a terminal supplied with the second voltage out of the cell region.

9. The circuit according to claim 5, which further comprises a third power supply line for supplying the first voltage to the cell via said first power supply line, and a fourth power supply line for supplying the second voltage to the cell via said second power supply line, said third and fourth power supply lines being arranged to be substantially parallel to said first and second substrate potential lines.

10. The circuit according to claim 9, wherein said third power supply line is connected to a terminal supplied with the first voltage out of the cell region, and said fourth power supply line is connected to a terminal supplied with the second voltage out of the cell region.

11. The circuit according to claim 1, wherein said first and second substrate potential lines are arranged in a direction substantially parallel to that of the first and second power supply lines, and a plurality of substrate potential supply cells are continuously or discontinuously arranged along said direction.

12. The circuit according to claim 1, wherein pluralities of first and second power supply lines are arranged in one direction, pluralities of first and second substrate potential lines are arranged in a direction substantially parallel to and/or different from said one direction, and a plurality of substrate potential supply cells are staggered or arranged at random.

13. A semiconductor integrated circuit, comprising:

a plurality of cells arranged in a cell region on a substrate and having at least one transistor;

a first power supply line for supplying a first voltage to the cells;

a second power supply line for supplying a second voltage to the cells;

a substrate potential line having a substrate potential; and a substrate potential supply cell arranged in the cell region, having no transistor, and connected to the substrate potential line to supply the substrate potential to the substrate.

14. The circuit according to claim 13, wherein said substrate potential supply cell is arranged at a position on the basis of a design standard about a distance between an element formed in the cell and a region for supplying the substrate potential to the substrate.

15. The circuit according to claim 13, wherein said substrate potential line is arranged in one direction different from that of the first and second power supply lines, and a plurality of substrate potential supply cells are continuously or discontinuously arranged along said one direction.

16. The circuit according to claim 13, wherein said substrate potential line is arranged in one direction different from that of the first and second power supply lines, and a plurality of substrate potential supply cells are arranged every other cell region along said one direction.

17. The circuit according to claim 15, which further comprises a third power supply line for supplying the first voltage to the cell via said first power supply line, and a fourth power supply line for supplying the second voltage to the cell via said second power supply line, said third and fourth power supply lines being arranged to be substantially parallel to said substrate potential line.

18. The circuit according to claim 16, which further comprises a third power supply line for supplying the first voltage to the cell via said first power supply line, and a fourth power supply line for supplying the second voltage to the cell via said second power supply line, said third and fourth power supply lines being arranged to be substantially parallel to said substrate potential line.

19. The circuit according to claim 13, wherein said substrate potential line is arranged in a direction substantially parallel to that of the first and second power supply lines, and a plurality of substrate potential supply cells are continuously or discontinuously arranged along said direction.

20. The circuit according to claim 13, wherein pluralities of first and second power supply lines are arranged in one direction, a plurality of substrate potential lines are arranged in a direction substantially parallel to and/or different from said one direction, and a plurality of substrate potential supply cells are staggered or arranged at random.

21. The circuit according to claim 1, wherein pluralities of first and second power supply lines are arranged in one direction, pluralities of first and second substrate potential lines are arranged in both directions substantially parallel to and different from said one direction, and a plurality of substrate potential supply cells are continuously arranged along said both directions.

22. The circuit according to claim 1, wherein said first and second substrate potential lines are arranged in one direction different from that of the first and second power supply lines, and a plurality of substrate potential supply cells are alternately arranged along said one direction.

23. The circuit according to claim 13, wherein pluralities of first and second power supply lines are arranged in one direction, said substrate potential line is arranged in a direction substantially parallel to and/or different from said one direction, and a plurality of substrate potential supply cells are staggered or arranged at random.

24. The circuit according to claim 13, wherein pluralities of first and second power supply lines are arranged in one direction, said substrate potential line is arranged in both directions substantially parallel to and different from said one direction, and a plurality of substrate potential supply cells are continuously arranged along said both directions.

25. The circuit according to claim 13, wherein said substrate potential line is arranged in one direction different from that of the first and second power supply lines, and a plurality of substrate potential supply cells are alternately arranged along said one direction.

26. The circuit according to claim 1, wherein the at least one transistor is an N-channel or P-channel transistor.

27. The circuit according to claim 13, wherein the at least one transistor is an N-channel or P-channel transistor.

* * * * *